US005533665A

United States Patent [19]
Sinclair et al.

[11] Patent Number: 5,533,665
[45] Date of Patent: Jul. 9, 1996

[54] METHOD OF MAKING A PRINTED CIRCUIT BOARD WITH ADAPTOR PINS

[75] Inventors: William Y. Sinclair, Frenchtown; James P. Walter, Bloomsbury, both of N.J.

[73] Assignee: Aries Electronics, Inc., Frenchtown, N.J.

[21] Appl. No.: 360,403

[22] Filed: Dec. 21, 1994

Related U.S. Application Data

[63] Continuation of Ser. No. 199,764, Feb. 18, 1994, Pat. No. 5,410,452.

[51] Int. Cl.⁶ .................................................... H05K 3/34
[52] U.S. Cl. .................. 228/180.1; 228/135; 228/248.1; 29/843; 29/845
[58] Field of Search ............................... 228/135, 180.1, 228/248.1; 29/843, 845

[56] References Cited

U.S. PATENT DOCUMENTS

| | | | |
|---|---|---|---|
| 3,254,323 | 5/1963 | Wyse | 439/457 |
| 3,790,866 | 2/1974 | Meyer et al. | 257/702 |
| 3,866,998 | 2/1975 | Iantorno | 439/870 |
| 4,110,904 | 9/1978 | Johnson | 29/827 |
| 4,257,667 | 3/1981 | Iantorno | 439/844 |
| 4,404,172 | 1/1985 | Leary et al. | 361/780 |
| 4,631,639 | 12/1986 | Biraud | 361/807 |
| 5,129,573 | 7/1992 | Duffey | 228/135 |
| 5,257,165 | 10/1993 | Chiang | 361/748 |

Primary Examiner—Samuel M. Heinrich
Attorney, Agent, or Firm—Anthony J. Casella; Gerald E. Hespos

[57] ABSTRACT

An adaptor pin for connection to a printed circuit board includes an elongated electrically conductive pin having an enlarged portion adjacent one end for forming a mechanical interference fit with a hole partially drilled through the circuit board. The pin has an enlarged cross-sectional solder portion intermediate the enlarged portion and the opposite end of the pin so as to limit the extent of penetration of the pin into the hole of the circuit board. The enlarged portion of each pin is electrically connected by soldering to a circuit path on the circuit board. By this arrangement, a rigid mechanical connection between the pin and the circuit board is effected, and thus subsequent reheating of the board for connecting a surface mounted chip to the opposite side of the board will not interfere with the electrical and mechanical connection between the adaptor pin and the circuit board.

4 Claims, 2 Drawing Sheets

METHOD OF MAKING A PRINTED CIRCUIT BOARD WITH ADAPTOR PINS

This application is a continuation of application Ser. No. 08/199,764 filed Feb. 18, 1994, now U.S. Pat. No. 5,410,452, issued Apr. 25, 1995.

FIELD OF THE INVENTION

The present invention relates to electronic circuit interconnection, and more particularly, to apparatus for interconnecting separable electronic circuits along defined electronic circuit interfaces.

BACKGROUND OF THE INVENTION

In the modern electronics industry integrated circuits and similarly mechanically configured devices frequently are used. Such devices may be, for example, a microprocessor, a read only memory (ROM), a random access memory (RAM), logic arrays, integrated logic circuits, switches, etcetera. These devices usually are mechanically configured to have a three dimensional rectangular or square package body within which the active or passive circuit components, switches, etcetera are contained, and a plurality of electrical leads extending outwardly from the package to provide electrical connections for respective circuits within the package to circuitry externally of the package. More particularly, the package is usually designed for connection to circuitry on a printed circuit board. In many instances, the electrical devices are surface mounted to the circuit board, thereby lowering the profile of the overall structure, and also obviating the requirement for intermediate sockets, such as dual-in-line packages (DIP). In turn, the circuitry on the side of the printed circuit board to which the surface mounted electrical devices connected is, in turn, connected via circuitry included plated through holes to circuitry on the opposite side of the printed circuit board. In many instances, it is desireable to have leads extending from the opposite side of the printed circuit board for connection via a socket to other portions of the electrical system.

Heretofore, in order to connect a plurality of parallel pins to one side of a circuit board opposite to the side on which the chips are surface mounted, the industry has adopted a procedure wherein a plurality of pins are first held within a jig, and a planar plastic carrier is molded about the pins and is disposed orthogonal to the longitudinal axes of the parallel spaced pins. Each pin extends from opposite sides of the planar plastic carrier, and at the corners of the plastic carrier there are provided plastic locator buttons. The printed circuit board similarly includes openings for accommodating the plastic locator buttons. The circuitry on the side of the printed circuit board to which the pins are to be connected have solder pads corresponding to the locations of the pins within the carrier. With the locator buttons being disposed in the corresponding holes in the printed circuit board, one end of each pin engages a solder pad, and the assembly is then placed in an oven where the temperature is brought up very gradually to where the solder melts and thus mechanically and electrically connects the pins to the printed circuit boards. Thereafter, the temperature of the composite structure is brought down very slowly so as to minimize a disconnection of the ends of the pins from the printed circuit board. The problem then faced by the manufacturer is that the printed circuit board would have to again be heated at a later time when the chips are surface mounted to the opposite side of the printed circuit board. In order to minimize the possibility of causing the solder connection of any one pin to the circuit board from being disengaged during reheating, the entire peripheral edge spacing between the printed circuit board and the plastic carrier is encapsulated or sealed with a plastic epoxy. During the subsequent reheating of the assembly in order to form an electrical connection by surface mounting of a chip to the opposite side of the board, if the oven temperature becomes high enough, the heat will melt the solder connection between a pin and the opposite side of the circuit board, thereby rendering the assembly useless. In addition, unless care is taken by the users of the assembly when plugging the pins into a socket or the like, it is possible that one or more leads may be bent or distorted, thereby possibly breaking a solder connection of a pin to the face of the printed circuit board.

Accordingly, it is an object of the subject invention to provide a new and improved printer circuit board electrical adaptor pin which is rigidly connected to a printed circuit board, and which does not require the use of a plastic carrier for holding the adaptor pin prior to connection to a printed circuit board.

It is a further object of the subject invention to provide an improved printed circuit board electrical adaptor pin which forms a rigid and electrically stable connection to a printed circuit board and which does not require encapsulation by a plastic epoxy for shielding the electrical connection from the effects of heat as surface mounted chips are connected to the opposite side of the printed circuit board.

SUMMARY OF THE INVENTION

The subject invention overcomes the shortcomings of the prior art and provides a new and improved printed circuit board electrical adaptor pin which provides a more reliable, rigid and better electrical connection to a printed circuit board. To achieve that end, the subject invention provides an adaptor pin for connection to a leadless chip carrier printed circuit board. The adaptor pin includes an elongated electrically conductive pin, having an enlarged portion provided at one end of the pin for forming a mechanical interference fit with a hole that is partially drilled through the printed circuit board. The elongated conductive pin further includes an enlarged cross-sectional solder portion intermediate the enlarged portion and the opposite end of the pin, and the enlarged cross-sectional solder portion operates to limit the extent of penetration of the elongated pin into the hole predrilled in the circuit board. Prior to inserting the enlarged portion of the pin into the predrilled hole in the printed circuit board, solder paste is placed in the hole such that as the elongated pin is mechanically forced into the hole the solder paste flows upwardly to the surface of the board for subsequently forming an electrical connection to a printed circuit path on the printed circuit board. The enlarged portion of each pin is electrically connected by soldering to a circuit path on the circuit board and by this arrangement, both a rigid mechanical connection between the pin and the circuit board is effected and at the same time an electrical connection between the pin and the circuit path on the board is effected. Subsequent heating of the board for electrically connecting surface mounted chips to the opposite side of the board will not interfere with the electrical and mechanical connection between the adaptor pin of the subject invention and the circuit board because of the intimate mechanical and electrical connection between the subject adaptor pin and the circuit board. To enhance the mechanical connection between the enlarged portion of the adaptor pin and the predrilled hole in the circuit board, the enlarged portion of the adaptor is formed with a knurled configuration, and preferably a series of striations which extend along the longitudinal axis of the pin. The striations have sharp longitudinally extending edges which effectively cut into the plastic circuit board, and thus form an interference fit with the circuit board.

As an example of an application of the printed circuit board electrical adaptor pin of the subject invention, in connection with a printed circuit board made of standard FR-4 fiberglass material, and having a total thickness of 0.062 inches, the hole to be drilled into the circuit board material would be on the order of 0.045 inches, and with the diameter of the hole being 0.025 inches. The maximum diameter of the knurled portion of the printed circuit board electrical adaptor pin of the subject invention is preferably 0.028 inches, thereby resulting in a press fit mechanical connection between the adaptor pin and the circuit board. Prior to the insertion of the subject adaptor pin into the predrilled hole, solder paste is screened onto the circuit board so as to enter the respective holes. As the adaptor pins are force fit into the holes, the solder paste squeezes past the edges of the pin and flows up to the surface of the printed circuit board adjacent the enlarged portion of the adaptor pin and into contact with a printed circuit path on the circuit board. The circuit board is then slowly heated to effect soldering between the adaptor pins and their respective circuit paths on the printed circuit board. When fully assembled, there is no need for concern when the printed circuit board is reheated as part of surface mounting chips on the opposite side of the surface board, nor is there any requirement for utilizing a plastic epoxy in order to shield the soldered connections between the adaptor pins of the subject invention and the circuit paths on the circuit board. Still further, there is no need, as in the prior art system described above, for utilizing a plastic carrier for holding the pins in position prior to connecting the pins to the printed circuit board.

DETAILED DESCRIPTION OF THE PREFERRED EMBODIMENT

Figure 1:
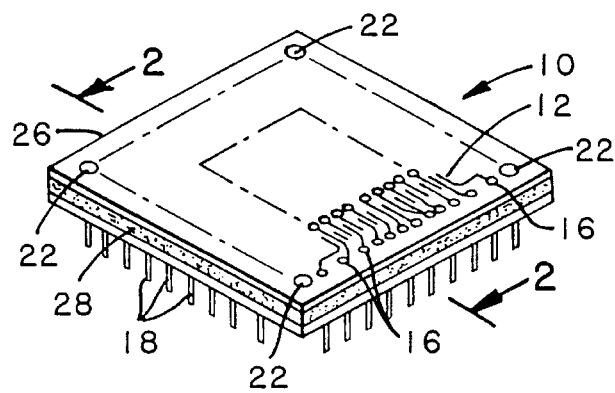
FIG. 1 is a perspective view of a chip carrier printed circuit board of the prior art.
Figure 2:
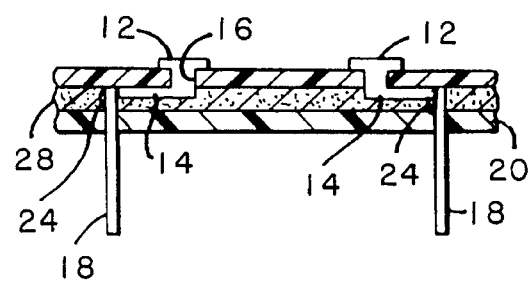
FIG. 2 is a cross-sectional view of the prior art device taken along line 2—2 in FIG. 1.

Turning to FIGS. 1 and 2, a chip carrier printed circuit board assembly 10 is shown as including printed circuitry 12 and 14 disposed on opposite sides of the board 10, with the circuitry 12 and 14 being interconnected in a conventional manner by plated through holes 16. As shown in FIG. 1, the printed circuitry 12 on one side of the printed circuit board 10 is aligned in a manner for surface mounting of an integrated circuit of generally rectangular configuration, with the integrated circuit being, for example, a microprocessor, a read only memory (ROM), a random access memory (RAM), logic arrays, integrated logic circuits, switches and the like. The circuitry 14 on the opposite side of the printed circuit board is designed for connection to a matrix of leads 18 for subsequent connection via a conventional socket to other portions of the electrical system. In the prior art system as shown in FIGS. 1 and 2, the leads are in the form of elongated cylindrical pins 18 which are first mounted in a jig in parallel relationship in the desired matrix, and thereafter a plastic planar carrier 20 is molded about the pins 18, with the axes of the pins parallel 18 being disposed generally orthogonal to the planar surface of the plastic carrier 20. Each pin 18 extends from opposite sides of the planar plastic carrier 20, and the carrier usually includes locator buttons (not shown) to be aligned and inserted into suitable apertures 22 at the corners of the printed circuit board 10. With the locator buttons being disposed in the corresponding holes 22 in the printed circuit board 10, one end of each pin 18 engages a solder pad 24 connected to a circuit path 14, and the entire assembly is then placed in an oven where the temperature is brought up very gradually to where the solder melts and thus a mechanical and electrical connection between the pins 18 and the printed circuit board 10 is effected. Thereafter, the temperature of the composite structure is brought down very slowly so as to minimize a disconnection of the ends of the pins 18 from the circuitry 14 on the printed circuit board 10. As noted above, the problem then faced by the manufacturer of the devices is that the printed circuit board assembly 10 must later be reheated when the integrated logic circuit is surface mounted to the leads 12 on the opposite side of the printed circuit board 10. At such time, in order to minimize the possibility of causing an electrical disconnection of any one pin 18 to its associated circuit path 14 on the printed circuit board 10, the spacing between the peripheral edge 26 of the printed circuit board and the planar plastic carrier 20 is encapsulated or sealed with a plastic epoxy 28. Accordingly, during the subsequent reheating of the assembly 10 in order to form an electrical connection by surface mounting of an integrated logic circuit to the printed circuit board, it is hoped that the encapsulation 28 will preclude electrical disconnection between the cylindrical pins 18 and the printed circuit paths 14. As can also readily be apparent, because of the fact that the pins 18 are merely surface mounted and connected to the circuit paths 14, care must be constantly exercised when plugging the pins 18 into a socket or the like in order to preclude bending of the pins 18 which could cause a electrical disconnection between the solder connection of the pins 18 and the circuit paths 14.

Figure 3:
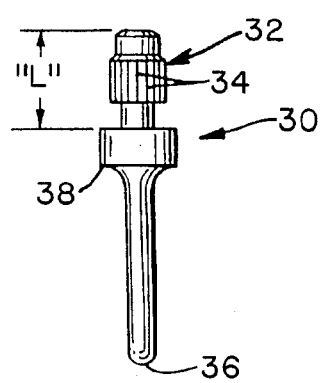
FIG. 3 is an elevational view of the printed circuit board electrical adaptor pin of the subject invention.
Figure 4:
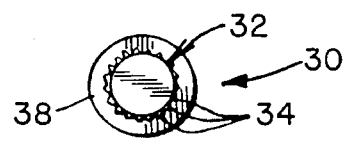
FIG. 4 is a top plan view of the printed circuit board electrical adaptor pin of the subject invention.

Turning to FIGS. 3 and 4, the new and improved printed circuit board electrical adaptor pin of the subject invention is generally designated by the numeral 30. Adaptor pin 30 includes an elongated electrically conducted pin having an enlarged portion 32 provided at one end for forming a mechanical interference fit with a hole that is partially drilled through a printed circuit board. The enlarged portion 32 is knurled and comprises a plurality of striations 34, with the maximum diameter of the knurled portion 32 being greater than the diameter of the predrilled hole in the printed circuit board. Disposed intermediate the knurled portion 32 and the opposite end 36 of the adaptor pin 30 is an enlarged cross-sectional solder portion 38 which is of greater diameter than the diameter of the knurled portion 32. The enlarged cross-sectional solder portion 38 operates to limit the extent of penetration of the adaptor pin 30 into the hole predrilled in the circuit board. The length "L" of the adaptor pin 30 between the enlarged cross-sectional solder portion 38 and the knurled portion 32 is less than the depth of the hole predrilled in the printed circuit board. As an example, when the adaptor pin 30 of the subject invention is used in conjunction with a standard FR-4 fiberglass printed circuit board having a total thickness of 0.062 inches, the hole to be drilled into the circuit board material would be on the order of 0.045 inches, with the diameter of the hole being 0.025 inches. The maximum diameter of the knurled portion 32 of the adaptor pin 30 is preferably 0.028 inches, thereby resulting in a press-fit mechanical connection between the knurled portion 32 of the adaptor pin 30 and the walls of the predrilled hole. The length "L" is less than the depth of the predrilled hole, 0.045 inches, thereby enabling solder paste to be placed in the hole prior to force fitting the adaptor pin 30 into the predrilled hole.

Figure 5:
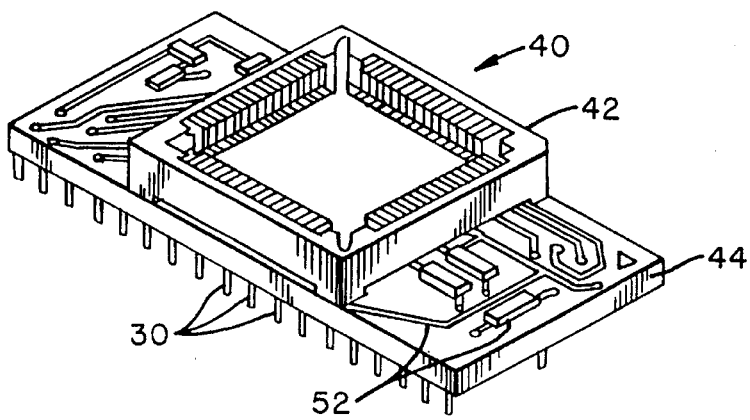
FIG. 5 is a perspective view of a printed circuit board utilizing the adaptor pins of the subject invention, and illustrating the opposite side of the printed circuit board from which the adaptor pins extend.

FIG. 5 illustrates a circuit board assembly 40 to which the adaptor pins 30 of the subject invention are assembled. In the perspective view of FIG. 5, the side of the printed circuit board opposite from which the pins 18 extend is shown, as including various electrical circuits and a socket 42 for accommodating an integrated logic circuit (not shown).

Figure 6:
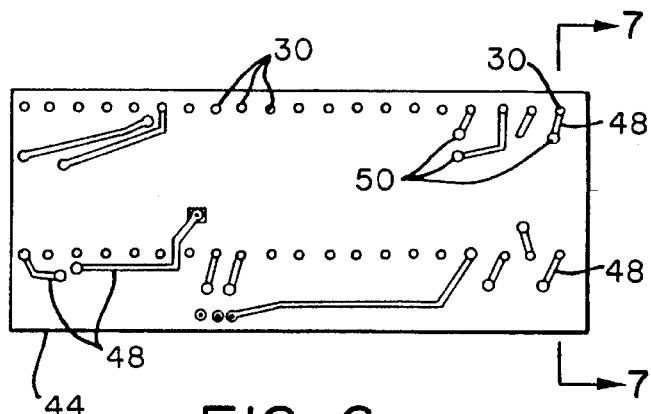
FIG. 6 is a bottom plan view of the leadless chip carrier printed circuit board of FIG. 5 and illustrating the adaptor pins of the subject invention as mounted in the printed circuit board.
Figure 7:
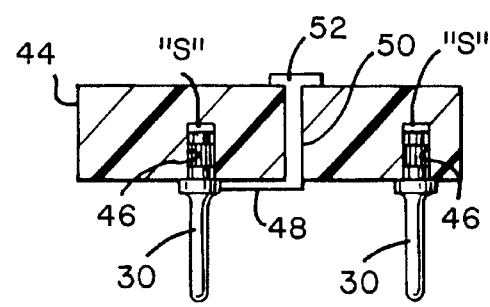
FIG. 7 is a cross-sectional view taken along line 7—7 in FIG. 6.

As shown in FIGS. 6 and 7, the fiberglass printed circuit board 44 is predrilled with holes 46 which are partially drilled through the fiberglass circuit board 40 and are adapted to receive the knurled ends of the adaptor pins 30. Prior to insertion of the adaptor pins 30 into the partially drilled holes 46, solder paste "S" is added to each hole, and as the adaptor pins 30 are press fit into the holes 46 in order to form a rigid mechanical connection with the fiberglass printed circuit board 40, the solder paste "S" flows along the side walls of the predrilled hole 46 and engages the associated printed circuit paths 48 disposed on the lower surface of the fiberglass printed circuit board, as shown in FIG. 7. The circuit paths 48 extend to plated through holes 50 to circuitry 52 disposed on the opposite side of the printed circuit board. After the adaptor pins 30 are fully seated in their respective predrilled holes 46, the entire assembly is subjected to a slow heating process in order to form the soldered connections between the adaptor pins 30 and the paths 48 on the printed circuit board 44.

Because of the strong mechanical connection between the adaptor pins 30 and the fiberglass printed circuit board 40, subsequent reheating of the board in order to effect surface mounting of other devices to the opposite side of the printed circuit board will not affect the electrical integrity of the connections between the adaptor pins 30 and the printed circuitry 48. Furthermore, because of the rigid mechanical connection between the adaptor pins 30 and the printed circuit board 40, the pins 30 are better able to withstand bending forces and abusive interconnections with sockets to which the electrical device 40 is subsequently connected. In addition, there is no need, when employing the adaptor pins 30 of the subject invention, to employ the preliminary steps of molding a planar carrier about the matrix of adaptor pins before connection of the adaptor pins to the printed circuit board. Accordingly, there is provided a new and improved printed circuit board adaptor pin 30 which forms a rigid and electrically stable connection to a printed circuit board, and which does not require encapsulation of a plastic epoxy for shielding the electrical connection from the effects of heat as surface mounted chips are connected to the opposite side of the printed circuit board. The new and improved chip carrier electrical adaptor pin of the subject invention forms a rigid connection to the printed circuit board, and also does not require the use of a plastic carrier for holding the adaptor pins prior to connection to the printed circuit board.

Figure 8:
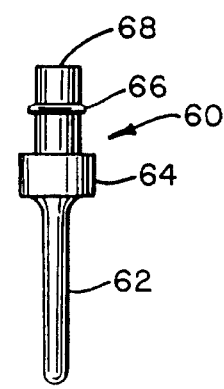
FIG. 8 is a side elevational view of an another embodiment of the printed circuit board electrical adaptor pin of the subject invention.

An alternate embodiment of the subject adaptor pin is shown in FIG. 8 and is generally designated by the numeral 60. Adaptor pin 60 comprises an elongated electrical contact pin 62 having an enlarged cross-sectional solder portion 64 disposed intermediate the opposite ends of the pin 62, and a peripheral bead or radially-enlarged annular projection 66 disposed between the enlarged cross-sectional solder portion 64 and one end 68 of the pin for forming an interference fit with a predrilled hole in a printed circuit board. As in the first embodiment of the subject invention, the diameter of the annular projection is greater than the diameter of the predrilled hole in the printed circuit board to achieve the interference fit and thereby achieve a strong mechanical connection between the adaptor pin 60 and the printed circuit board.

While the invention has been described relative to several preferred embodiments, it is apparent that various changes can be made thereto without departing from the spirit and the scope of the invention as defined by the appended claims.

What is claimed is:

1. A method of making a printed circuit board with adaptor pins for connection to external circuitry comprising the steps of:

providing a planar circuit board having a printed circuit pattern on one side thereof for mounting of electrical components, and a printed circuit on the opposite side thereof, with said printed circuit pattern and said printed circuit being electrically interconnected;

forming a plurality of holes in said opposite side of the planar circuit board, each said hole having a depth less than the thickness of said planar printed circuit board, and each said hole being at the distal end of a lead of said printed circuit provided on the opposite side of said planar circuit board;

placing solder paste in each said hole in the planar circuit board;

inserting one end of an elongated, electrically-conductive adaptor pin into each said hole in the planar circuit board, said one end of each adaptor pin having an enlarged portion for effecting an interference fit with its respective hole, with the opposite end of each said adaptor pin extending externally of the planar circuit board for connection to external circuitry, each said adaptor pin further including an enlarged cross-sectional solder portion intermediate said enlarged portion and the external opposite end thereof, with said enlarged cross-sectional solder portion of each adaptor pin limiting the extent of penetration of said adaptor pin into the respective hole of the planar circuit board, and with the solder paste in each hole being forced by the adaptor pin to flow along the side walls of the respective hole and to engage the distal end of a lead of the printed circuit; and heating said assembly of the planar circuit board and the adaptor pins to effect soldered connections between the adaptor pins and the respective leads of the printed circuit.

2. A method of making a printed circuit board with adaptor pins for connection to external circuitry as in claim 1, wherein the holes in the planar circuit board are formed by drilling.

3. A method of making a printed circuit board with adaptor pins for connection to external circuitry comprising the steps of:

provided a planar circuit board having a printed circuit pattern on one side thereof for mounting of electrical components, and a printed circuit on the opposite side thereof, with said printed circuit pattern and said printed circuit being electrically interconnected;

forming a plurality of holes in said opposite side of the planar circuit board, each said hole having a depth less than the thickness of said planar printed circuit board, and each said hole being at the distal end of a lead of said printed circuit provided on the opposite side of said planar circuit board;

placing solder paste in each said hole in the planar circuit board;

inserting one end of an elongated, electrically-conductive adaptor pin into each said hole in the planar circuit board such that the solder paste in each hole is forced by the adaptor pin to flow along the side walls of the respective hole and to engage the distal end of a lead of the printed circuit; and heating said assembly of the planar circuit board and the adaptor pins to effect soldered connections between the adaptor pins and the respective leads of the printed circuit.

4. A method of making a printed circuit board with adaptor pins for connection to external circuitry as in claim 3, wherein the one end of the elongated adaptor pin which is inserted into the hole in the planar circuit board is of greater diameter than said hole to form an interference fit therewith.

* * * * *